United States Patent
Song et al.

(10) Patent No.: US 11,223,014 B2
(45) Date of Patent: *Jan. 11, 2022

(54) SEMICONDUCTOR STRUCTURES INCLUDING LINERS COMPRISING ALUCONE AND RELATED METHODS

(71) Applicant: Micron Technology, Inc., Boise, ID (US)

(72) Inventors: Zhe Song, Boise, ID (US); Tuman E. Allen, Kuna, ID (US); Cole S. Franklin, Boise, ID (US); Dan Gealy, Kuna, ID (US)

(73) Assignee: Micron Technology, Inc., Boise, ID (US)

( * ) Notice: Subject to any disclaimer, the term of this patent is extended or adjusted under 35 U.S.C. 154(b) by 203 days.

This patent is subject to a terminal disclaimer.

(21) Appl. No.: 16/446,746

(22) Filed: Jun. 20, 2019

(65) Prior Publication Data

US 2019/0312200 A1    Oct. 10, 2019

Related U.S. Application Data (63) Continuation of application No. 15/244,629, filed on Aug. 23, 2016, now Pat. No. 10,573,513, which is a
(Continued)

(51) Int. Cl.
*H01L 45/00* (2006.01)
*H01L 27/11582* (2017.01)
(Continued)

(52) U.S. Cl.
CPC ...... *H01L 45/1691* (2013.01); *H01L 21/0228* (2013.01); *H01L 21/02118* (2013.01);
(Continued)

(58) Field of Classification Search
None
See application file for complete search history.

(56) References Cited

U.S. PATENT DOCUMENTS 6,404,003 B1   6/2002   McMillan et al.
6,486,070 B1   11/2002  Ho et al.
(Continued)

FOREIGN PATENT DOCUMENTS

KR   10-2004-0068024 A   7/2004
KR   10-2008-0060321 A   7/2008
(Continued)

OTHER PUBLICATIONS

Park et al. Gas diffusion barrier characteristics of Al2O3/alucone films formed using trimethylaluminum, water and ethylene glycol for organic light emitting diode encapsulation, Thin Solid Films, 546, 2013, pp. 153-156. (Year: 2013).*
(Continued)

*Primary Examiner* — Erik T. K. Peterson
(74) *Attorney, Agent, or Firm* — TraskBritt (57) ABSTRACT

A semiconductor device including stacked structures. The stacked structures include at least two chalcogenide materials or alternating dielectric materials and conductive materials. A liner including alucone is formed on sidewalls of the stacked structures. Methods of forming the semiconductor device are also disclosed.

18 Claims, 9 Drawing Sheets

Related U.S. Application Data continuation of application No. 14/189,323, filed on Feb. 25, 2014, now Pat. No. 9,484,196.

(51) Int. Cl.
| | |
|---|---|
| *H01L 21/02* | (2006.01) |
| *H01L 27/24* | (2006.01) |
| *H01L 21/033* | (2006.01) |
| *H01L 27/1157* | (2017.01) |

(52) U.S. Cl.
CPC .. *H01L 21/02178* (2013.01); *H01L 21/02362* (2013.01); *H01L 21/0337* (2013.01); *H01L 27/1157* (2013.01); *H01L 27/11582* (2013.01); *H01L 27/2409* (2013.01); *H01L 27/249* (2013.01); *H01L 27/2427* (2013.01); *H01L 45/06* (2013.01); *H01L 45/065* (2013.01); *H01L 45/126* (2013.01); *H01L 45/1233* (2013.01); *H01L 45/141* (2013.01); *H01L 45/1608* (2013.01); *H01L 45/1675* (2013.01)

(56) References Cited

U.S. PATENT DOCUMENTS

| | | | |
|---|---|---|---|
| 7,215,564 | B2 | 5/2007 | Happ et al. |
| 7,482,616 | B2 | 1/2009 | Song et al. |
| 7,491,600 | B2 | 2/2009 | Prinz et al. |
| 7,700,472 | B2 | 4/2010 | Kim |
| 7,741,638 | B2 | 6/2010 | Stewart et al. |
| 7,838,860 | B2 | 11/2010 | Happ et al. |
| 7,875,516 | B2 | 1/2011 | Knoefler et al. |
| 7,936,027 | B2 | 5/2011 | Xiao et al. |
| 8,129,705 | B2 | 3/2012 | Kinoshita et al. |
| 8,143,610 | B2 | 3/2012 | Park et al. |
| 8,153,527 | B2 | 4/2012 | Loh et al. |
| 8,203,134 | B2 | 6/2012 | Liu |
| 8,207,557 | B2 | 6/2012 | Sills et al. |
| 8,237,213 | B2 | 8/2012 | Liu |
| 8,394,683 | B2 | 3/2013 | Ramaswamy et al. |
| 8,450,714 | B2 | 5/2013 | Yasutake |
| 8,519,371 | B2 | 8/2013 | Fukumizu et al. |
| 8,536,015 | B2 | 9/2013 | Scheuerlein et al. |
| 8,822,968 | B2 | 9/2014 | Inokuma |
| 8,902,634 | B2 | 12/2014 | Iwayama |
| 8,937,292 | B2 | 1/2015 | Bateman |
| 9,012,326 | B2 | 4/2015 | Kim et al. |
| 9,093,632 | B2 | 7/2015 | Tsubata et al. |
| 9,136,307 | B2 | 9/2015 | Pellizzer |
| 9,224,615 | B2 | 12/2015 | Chang et al. |
| 9,406,877 | B2 | 8/2016 | Tada et al. |
| 9,484,196 | B2 * | 11/2016 | Song ............... H01L 45/1233 |
| 9,748,311 | B2 | 8/2017 | Fantini et al. |
| 10,249,819 | B2 | 4/2019 | Campbell et al. |
| 10,573,513 | B2 * | 2/2020 | Song ................ H01L 21/02362 |
| 10,665,782 | B2 | 5/2020 | Campbell et al. |
| 2003/0142944 | A1 | 7/2003 | Sundar et al. |
| 2004/0227227 | A1 | 11/2004 | Imanaka et al. |
| 2005/0167842 | A1 | 8/2005 | Nakamura et al. |
| 2005/0263829 | A1 | 12/2005 | Song et al. |
| 2006/0056233 | A1 | 3/2006 | Parkinson et al. |
| 2006/0097240 | A1 | 5/2006 | Lowrey et al. |
| 2007/0105306 | A1 | 5/2007 | Prinz et al. |
| 2007/0117256 | A1 | 5/2007 | Stewart et al. |
| 2007/0166980 | A1 | 7/2007 | Lee et al. |
| 2007/0275560 | A1 | 11/2007 | Nishimura et al. |
| 2008/0102560 | A1 | 5/2008 | Hamamjy et al. |
| 2008/0124917 | A1 | 5/2008 | Oh et al. |
| 2008/0293207 | A1 | 11/2008 | Koutny et al. |
| 2008/0315359 | A1 | 12/2008 | Happ et al. |
| 2009/0072274 | A1 | 3/2009 | Knoefler et al. |
| 2009/0231911 | A1 | 9/2009 | Liu et al. |
| 2009/0251944 | A1 | 10/2009 | Happ et al. |
| 2009/0302362 | A1 | 12/2009 | Kikuchi et al. |
| 2010/0032637 | A1 | 2/2010 | Kinoshita et al. |
| 2010/0155723 | A1 * | 6/2010 | Bornstein ............... H01L 45/12 257/43 |
| 2010/0163818 | A1 | 7/2010 | Lee et al. |
| 2010/0237502 | A1 | 9/2010 | Yu et al. |
| 2011/0068313 | A1 | 3/2011 | Liu |
| 2011/0244666 | A1 | 10/2011 | Kim et al. |
| 2011/0272664 | A1 | 11/2011 | Tada et al. |
| 2012/0001145 | A1 | 1/2012 | Magistretti et al. |
| 2012/0040528 | A1 | 2/2012 | Kim et al. |
| 2012/0080792 | A1 | 4/2012 | Zhao |
| 2012/0098146 | A1 | 4/2012 | Lee |
| 2012/0181596 | A1 | 7/2012 | Liu |
| 2012/0220099 | A1 | 8/2012 | Dennison |
| 2012/0225534 | A1 | 9/2012 | Lee et al. |
| 2012/0235109 | A1 | 9/2012 | Nojiri |
| 2012/0236642 | A1 | 9/2012 | Lue |
| 2012/0313064 | A1 | 12/2012 | Nishimura |
| 2012/0313199 | A1 | 12/2012 | Orita et al. |
| 2012/0315384 | A1 | 12/2012 | Abd et al. |
| 2013/0016557 | A1 | 1/2013 | Kim |
| 2013/0043455 | A1 | 2/2013 | Bateman |
| 2013/0056698 | A1 | 3/2013 | Satoh et al. |
| 2013/0137275 | A1 | 5/2013 | Tong et al. |
| 2013/0207068 | A1 | 8/2013 | Pellizzer |
| 2013/0294152 | A1 | 11/2013 | Kau et al. |
| 2013/0333835 | A1 | 12/2013 | Carcia et al. |
| 2014/0048795 | A1 | 2/2014 | Kim et al. |
| 2014/0168490 | A1 | 6/2014 | Imamura |
| 2014/0170234 | A1 | 6/2014 | Van et al. |
| 2014/0190565 | A1 | 7/2014 | Jung et al. |
| 2014/0273516 | A1 | 9/2014 | Xia et al. |
| 2014/0273524 | A1 | 9/2014 | Nguyen et al. |
| 2015/0041749 | A1 | 2/2015 | Liu et al. |
| 2015/0069473 | A1 | 3/2015 | Glass et al. |
| 2015/0069559 | A1 | 3/2015 | Tsubata et al. |
| 2015/0069581 | A1 | 3/2015 | Chang et al. |
| 2015/0137061 | A1 | 5/2015 | Donghi et al. |
| 2015/0171324 | A1 | 6/2015 | Mikawa et al. |
| 2015/0179706 | A1 | 6/2015 | Rocklein et al. |
| 2015/0243708 | A1 | 8/2015 | Ravasio et al. |
| 2015/0243709 | A1 | 8/2015 | Song et al. |
| 2015/0243885 | A1 | 8/2015 | Sciarrillo |
| 2015/0287916 | A1 | 10/2015 | Campbell et al. |
| 2016/0056208 | A1 | 2/2016 | Pellizzer et al. |
| 2016/0133671 | A1 | 5/2016 | Fantini et al. |

FOREIGN PATENT DOCUMENTS

| | | |
|---|---|---|
| KR | 10-2010-0018445 A | 2/2010 |
| WO | 2015/088921 A1 | 6/2015 |

OTHER PUBLICATIONS

Jen et al., Critical Tensile Strain and Water Vapor Transmission Rate for Nanolaminate Films Grown Using Al2O3 Atomic Layer Deposition and Alucone Molecular Layer Deposition, Applied Physics Letters, vol. 101, (2012), pp. 234103-1-234103-3.

Yoon et al. Molecular Layer Deposition of Hybrid Organic-Inorganic Alucone Polymer Films Using a Three-Step ABC Reaction Sequence, Chem. Mater. 21 (2009) pp. 5365-5374.

Sniegowski et al. IC-Compatible Polysilicon Surface Micromachining, Annu. Rev. Mater. Sci. 30 (2000) pp. 299-333.

Seghete et al., Sacrificial Layers for Air Gaps in NEMS Using Alucone Molecular Layer Deposition, Sensors and Actuators A:Physical, (2009), doi: 10.1016/j.sna.2008.12.016, 8 pages.

Miller et al., Thermo-Mechanical Poperties of Alumina Films Created Using the Atomic Layer Deposition Technique, Sensorsand Actuators A: Physical, vol. 164 (2010), pp. 58-67.

Miller et al., Termomechanical Properties of Aluminum Alkoxide (Alucone) Films Created Using Molecular Layer Deposition, Acta Malerialia, vol. 57 (2009), pp. 5083-5092.

Lee et al., Growth and Properties of Hybrid Organic-Inorganic Melalcone Films Using Molecular Layer Deposition Techniques, Adv. Funct. Mater., vol. 23, (2013), pp. 532-546.

Lee et al., Characteristics of SiOC(-H) Thin Films Prepared by Using Plasma-Enhanced Atomic Layer Deposition, Journal of the (56) References Cited

OTHER PUBLICATIONS

Korean Physical Society, vol. 59, No. 5, Nov. 2011, pp. 3074-3079.
Lee et al. Alucone Alloys with Tunable Properties Using Alucone Molecular Layer Deposition and Al2O3 Atomic Layer Deposition, J. Phys. Chem. C, 116 (2012) pp. 3250-3257.
Gonzalez et al., Charge Trapping Analysis of Al2O3 Films Deposited by Atomic Layer Deposition Using H2O or O3 as Oxidant, J. Vacuum Sci. & Tech., vol. B 31, 01A101, 6 pages.
Dameron et al., Molecular Layer Deposition of Alucone Polymer Films Using Trimethylaluminum and Ethylene Glycol, Chem. Mater, vol. 20, (2008), pp. 3315-3326.
"Fabrication of the Si2Sb2Te5 Phase Change Cell Structure for PCRAM by Using UV Nanoimprint Lithography", 2008 IEEE.
"Current Status of the Phase Change Memory and its Future", 2003 IEEE.

\* cited by examiner

SEMICONDUCTOR STRUCTURES INCLUDING LINERS COMPRISING ALUCONE AND RELATED METHODS

CROSS-REFERENCE TO RELATED APPLICATIONS

This application is a continuation of U.S. patent application Ser. No. 15/244,629, filed Aug. 23, 2016, now U.S. Pat. No. 10,573,513, issued Feb. 25, 2020, which is a continuation of U.S. patent application Ser. No. 14/189,323, filed Feb. 25, 2014, now U.S. Pat. No. 9,484,196, issued Nov. 1, 2016, which application is related to U.S. patent application Ser. No. 14/189,265, filed Feb. 25, 2014 and entitled CROSS-POINT MEMORY AND METHOD FOR FABRICATION OF SAME, and to U.S. patent application Ser. No. 14/189,490, filed Feb. 25, 2014 and entitled CROSS-POINT MEMORY AND METHODS FOR FABRICATION OF SAME, the disclosure of each of which is hereby incorporated herein it its entirety by this reference.

FIELD

Embodiments disclosed herein relate to semiconductor devices including memory cells having liner materials and methods of forming such devices. More specifically, embodiments disclosed herein relate to structures for increasing memory density and methods of forming such structures.

BACKGROUND

Due to rapid growth in use and applications of digital information technology, there are demands to continuingly increase the memory density of memory devices while maintaining, if not reducing, the size of the devices. Three-dimensional (3D) structures have been investigated for increasing the memory density of a device. For example, 3D cross-point memory cells and 3D-NAND cells have been investigated as devices with increased capacity and smaller critical dimensions. Typically, these 3D structures include stacks of memory cells that may include phase change materials, switching diodes, charge storage structures (e.g., floating gates, charge traps, tunneling dielectrics), a stack of alternating control gates and dielectric materials, and charge blocking materials between the charge storage structures and adjacent control gates.

Fabrication of conventional semiconductor devices often requires creating high aspect ratio openings in a stack of alternating materials on a substrate. Frequently, materials that are highly sensitive to downstream processing conditions are used as part of the stack structures. For example, stacks in 3D memory arrays may comprise materials such as chalcogenides, carbon containing electrodes, or other sensitive materials that may be damaged at higher temperatures used during conventional semiconductor fabrication processes or may react with etchants used during downstream processing. Aluminum oxide has been used as a liner material to protect the sensitive materials of the stack structures. However, aluminum oxide may resputter and redeposit on surfaces of a semiconductor structure during etching. As the aluminum oxide resputters, it may undesirably form in bottom portions or corners of trench structures or undesirably redeposit on other portions of the semiconductor structure. Additionally, removing the aluminum oxide without damaging the sensitive materials of the stack structures has proven to be difficult. Aluminum oxide exhibits high dry etch resistance to $CF_x$ based dry etch chemistries and $O_2$-plasma based carbon etch chemistries.

In addition, as the number of materials in the stacks increase, the depth and aspect ratio (i.e., the ratio of width to depth) of trenches located between adjacent stack structures increases. It is important to constrain the critical dimension of the structure as the trenches are formed. Therefore, it would be desirable to form high aspect ratio trenches between stack structures in a device having a 3D architecture without increasing the critical dimension of the structure.

DETAILED DESCRIPTION

The illustrations included herewith are not meant to be actual views of any particular systems or memory structures, but are merely idealized representations that are employed to describe embodiments described herein. Elements and features common between figures may retain the same numerical designation except that, for ease of following the description, for the most part, reference numerals begin with the number of the drawing on which the elements are introduced or most fully discussed.

The following description provides specific details, such as material types, material thicknesses, and processing conditions in order to provide a thorough description of embodiments described herein. However, a person of ordinary skill in the art will understand that the embodiments disclosed herein may be practiced without employing these specific details. Indeed, the embodiments may be practiced in conjunction with conventional fabrication techniques employed in the semiconductor industry. In addition, the description provided herein does not form a complete process flow for manufacturing 3D semiconductor structures, and the structures described below do not form a complete semiconductor device. Only those process acts and structures necessary to understand the embodiments described herein are described in detail below. Additional acts to form a complete semiconductor device including the structures described herein may be performed by conventional techniques.

In some embodiments disclosed herein, a liner formed on sidewalls of stacks may prevent undesired etching or damage to materials comprising the stacks. The liner is formed from an aluminum-containing material, such as alucone. The liner may passivate the sidewalls of the stacks and may be formed during formation of the stacks. The aluminum-containing material may exhibit good adhesion to the materials of the stack, such as carbon materials, phase change materials, or electrode materials. In addition, the aluminum-containing material may be substantially conformally formed over the materials of the stack. The aluminum-containing material may also be formed at a low temperature, decreasing the potential of heat damage to the materials of the stack. Although the aluminum-containing material of the liner is formed at a low temperature, the aluminum-containing material is, nevertheless, easily removed selective to materials of the stack.

In some embodiments, the liner is formed on a first portion of sidewalls of the stacks after the stacks are only partially formed. After forming the partial liner, bottom portions of the liner may be removed and the stack may be further processed. In other embodiments, the liner is formed on sidewalls of the completed stacks and may remain in the final structure. The liner may function as a seal around the materials of the stack, preventing intermixing or migration of the stack materials. The liner material may, further, be oxidized to densify the liner.

Thus, the liner material may be formed over portions of a stack or over an entire stack structure. The liner may be beneficial in structures with a high aspect ratio and may be useful in protecting underlying reactive materials such as chalcogenides or other temperature sensitive materials. The liner may seal portions of the stack and may prevent migration of one material of the stack into another material of the stack.

According to embodiments disclosed herein, the liner may be formed within trenches formed in between adjacent stacks. The stacks may be comprised of various materials, depending on the desired function of the final device. For example, in 3D cross-point memory structures, the stacks may include various chalcogenide materials, electrode materials, and phase change materials. In 3D-NAND structures, the stacks may comprise alternating conductive materials and dielectric materials.

Figure 1A:
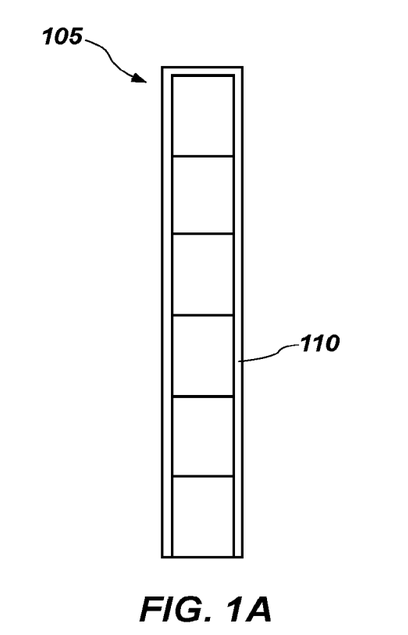
FIG. 1A through FIG. 1C are simplified cross-sectional views showing an alucone containing liner according to some embodiments of the present disclosure.

Referring to FIG. 1A, a liner 110 is formed over a stack 105 of materials. The materials of the stack 105 are discussed in more detail below. The liner 110 may comprise an aluminum-containing organic material, such as alucone. As used herein, the term "alucone" means and includes a material that contains aluminum atoms, carbon atoms, and oxygen atoms, such as an aluminum alkoxide polymeric material where the alkoxide is methoxide, ethoxide, propoxide, butoxide, pentoxide, hexoxide, or heptoxide. The alucone may be formed from alcohol precursors and organometallic precursors to form the aluminum alkoxide. The liner 110 may also include an aluminum-containing inorganic material in addition to the aluminum-containing organic material. In some embodiments, the inorganic material comprises aluminum oxide and the organic material comprises the alucone, with the ratio of alucone to aluminum oxide selected depending on the desired properties of the liner 110. The liner 110 may be homogeneous in its composition, such as including 100% alucone or a single ratio of alucone to aluminum oxide. However, the liner 110 may also include a gradient of aluminum oxide in the alucone. The liner 110 may be formed by atomic layer deposition (ALD) or molecular layer deposition (MLD). In some embodiments, the alucone is formed by MLD of tri-methyl aluminum (TMA) and ethylene glycol.

Figure 1B:
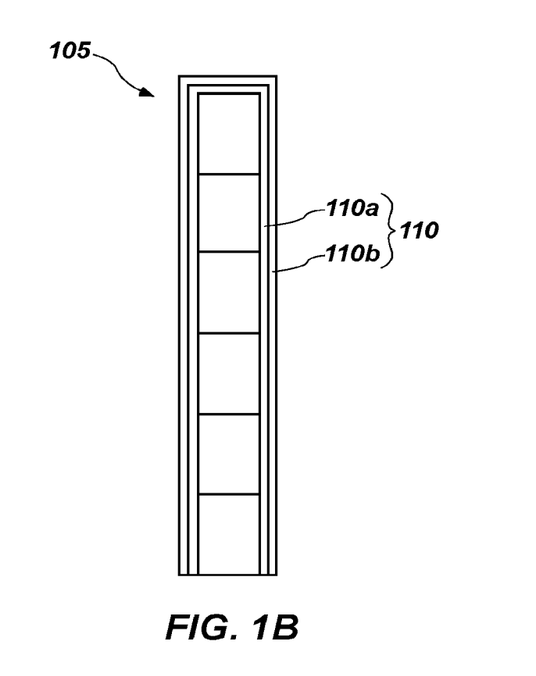

While the liner 110 in FIG. 1A is shown as a single material, the liner 110 may include at least a first portion 110a and a second portion 110b as shown in FIG. 1B, with each of the different portions including a different composition of the aluminum-containing material. The two portions may differ in the atoms that account for their respective compositions, or may differ in the relative content of the same atoms. Referring to FIG. 1B, the liner 110 may be formed over the stack 105 structure. By way of example only, the liner 110 may include a first portion 110a including aluminum oxide, and a second portion 110b including alucone. The first portion 110a comprising aluminum oxide may be in contact with the materials of the stack 105, enabling the alucone of the second portion 110b to adhere to the materials of the stack 105, such as carbon or chalcogenide materials. The second portion 110b of the liner 110 may include aluminum, carbon, and oxygen. In some embodiments, the alucone may optionally include silicon atoms, nitrogen atoms, or combinations thereof.

In some embodiments, the first portion 110a comprises a seed material of aluminum oxide and the second portion 110b comprises the alucone. In other embodiments, the liner 110 includes a ratio of aluminum oxide to alucone of approximately 1:1. The ratio of aluminum oxide to alucone may range from between about 1:1 to about 1:10 such as from between about 1:1 and about 1:5. Thus, for each monolayer of aluminum oxide formed, a monolayer of alucone may be formed. In other embodiments, for each monolayer of aluminum oxide formed, between about 1 monolayer and about 10 monolayers of alucone may be formed, such as between about 1 monolayer and about 5 monolayers of alucone. Since the aluminum oxide may exhibit increased adherence to the stack materials than the alucone material, the aluminum oxide may be in direct contact with the stack 105. The alucone may be formed over the aluminum oxide portion and may adhere to the aluminum oxide formed over the stack structure.

In other embodiments, the liner 110 may include a gradient of aluminum oxide and alucone. For example, the liner 110 may include an aluminum oxide material in direct contact with the stack 105. The concentration of alucone may increase from approximately zero percent at a surface proximal to the stack 105 to about one-hundred percent at an outer surface of the liner 110 (i.e., distal to the stack 105). Thus, the concentration of aluminum oxide may be approximately one-hundred percent near the surface of the stack 105 and may decrease to approximately zero percent at an outer surface of the liner 110.

Figure 1C:
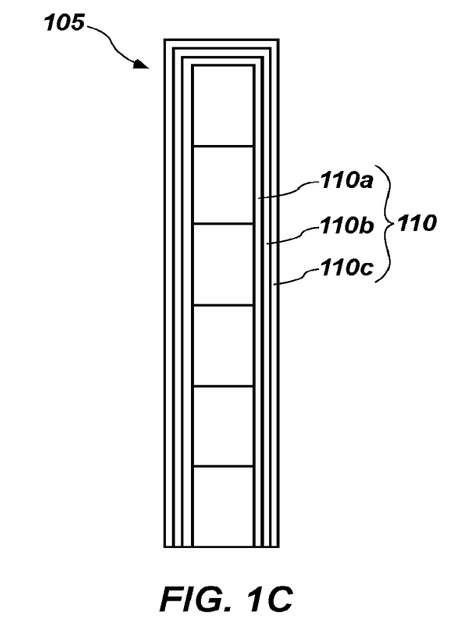

Referring to FIG. 1C, the liner 110 may comprise different portions with differing concentrations of alucone and aluminum oxide. For example, a first portion 110a of the liner 110 may be in contact with the stack 105 and may comprise an aluminum oxide material. The first portion 110a may comprise between about one monolayer and about ten monolayers of aluminum oxide. A second portion 110b may be formed over the first portion 110a and include an alucone material. The second portion 110b may include between about ten percent and about seventy percent alucone such as between about ten percent alucone and about thirty percent alucone. A third portion 110c may be formed over the second portion 110b and may have a higher alucone content than the second portion 110b. The third portion 110c may comprise between about fifty percent alucone to about one hundred percent alucone, such as between about fifty percent alucone and about seventy percent alucone, between about seventy percent alucone and about ninety percent alucone, or between about ninety percent alucone and about one-hundred percent alucone. The liner 110 may have the advantage of good adhesion to the stack structure while also exhibiting favorable etching characteristics.

In other embodiments, the liner 110 may comprise only (i.e., consist essentially of or consist of) an alucone material. The alucone material may be formed directly in contact with the stack 105.

The aluminum oxide portion of the liner 110, if present, may be formed by atomic layer deposition, chemical vapor deposition (CVD), plasma enhanced chemical vapor deposition (PECVD), or other deposition method. In some embodiments, the aluminum oxide is formed by atomic layer deposition. The aluminum oxide may be formed by pulsing aluminum precursors and oxygen containing precursors sequentially. Non-limiting examples of aluminum precursors include tris(diethylamino)aluminum (TDEAA), alkyl aluminum precursors such as tri-methyl aluminum (TMA), aluminum alkoxides such as aluminum isopropoxide (AlP), aluminum tri-sec-butoxide (ATSB), aluminum ethoxide, dimethylaluminumhydride (DMAH), aluminum tris(2,2,6,6-tetramethyl-3,5-heptanedionate), triisobutylaluminum (TIBA), tris(dimethylamido)aluminum(III), or combinations thereof. Oxygen containing precursors may include oxygen ($O_2$), ozone ($O_3$), water, or combinations thereof. In some embodiments the aluminum precursor is TMA and the oxygen containing precursor is water.

The alucone portion of the liner 110 may be formed by MLD or by ALD. The alucone material may be deposited in the same deposition chamber and at similar process conditions as the deposition of the aluminum oxide material, if present. For example, the alucone material may be formed at a temperature similar to the temperature at which the aluminum oxide is formed. By way of non-limiting example, the alucone material and the aluminum oxide may be formed at a temperature of between about 85° C. and about 175° C., such as between about 85° C. and about 135° C., or between about 135° C. and about 175° C. In some embodiments, the alucone and the aluminum oxide may be deposited at a temperature of approximately 175° C.

The alucone material may be formed using the same aluminum precursor as the aluminum oxide portion. The organic portion of the alucone material may be formed from a precursor including at least one hydroxyl group and carbon, such as a monofunctional or polyfunctional alcohol. The organic precursor may be pulsed after the aluminum precursor. Thus, the alucone portion of the liner material may be formed from an aluminum containing precursor and a carbon containing precursor. The carbon containing precursor may include ethylene glycol, 1,3-propylene glycol, glycerol (glycerin), other alcohols, or combinations thereof. In some embodiments, the alucone is formed by pulsing TMA with ethylene glycol. The resulting material may comprise an Al:$OCH_2CH_2$—O material. Each cycle of the aluminum containing precursor and the carbon containing precursor may form between about 1 Å and about 5 Å of the alucone material.

The alucone material may have a lower density and lower hardness than the aluminum oxide material. By incorporating alucone into the aluminum oxide material, the density and the hardness of the liner may be tunable compared to the density and the hardness of the aluminum oxide material. The density and hardness of the alucone material may be increased or decreased by, respectively, decreasing or increasing the carbon content of the carbon-containing precursor. Thus, in some embodiments, the alucone material may be formed with precursors in addition to or different from ethylene glycol. For example, rather than pulsing ethylene glycol, other carbon containing alcohols, such as 1,3-propylene glycol, glycerol (glycerin), 1,4-butanediol, glycols with more carbon atoms, or combinations thereof, may be used. By way of non-limiting example, pulsing 1,3-propylene glycol rather than ethylene glycol may increase the carbon content of the alucone material and may decrease the density of the alucone. In some embodiments, the carbon-containing precursor includes ethylene glycol and a different alcohol with a higher carbon content than ethylene glycol, such as 1,3-propylene glycol.

Optionally, the liner 110 may be modified by altering functional groups in the carbon containing precursor. By changing the functional group in the carbon containing precursor from a methyl constituent to an amine functional group, the composition of the liner 110 may be modified. For example, a hetero-bifunctional molecule such as ethanolamine may be used as the carbon containing precursor. Maleic anhydride or other cyclic anhydrides may be reacted with the amine groups from the ethanolamine to form exposed hydroxyl groups that may be reacted with the aluminum precursor in the next pulse of aluminum precursor. In other embodiments, the carbon-containing precursor may include other functional groups such as amino alcohols. Suitable amino alcohols may include methanolamine, propanolamine, a butanolamine, or combinations thereof. Alcohols with other functional groups may also be pulsed to alter the composition of the alucone material. For example, the modified precursor may be used with the carbon containing precursor such that the organic precursor includes a portion of ethylene glycol, 1,3-propylene glycol, glycerol, other alcohols and a portion of the modified precursor, such as methylamine.

Alternatively or additionally, the functional groups may be modified after deposition to alter a surface of the alucone material. In some embodiments, the functional group may be modified with a surfactant, such as a hydrophobic molecule or other wetting agents. The surfactants may help reduce toppling of stack structures exhibiting a high aspect ratio during subsequent processing steps. Surfactants, alcohols, solvents, or other wetting agents may also be used to align molecules during deposition of a seed material. In some embodiments, a precursor containing the surfactant may be added to the MLD recipe during the last MLD cycles. The surfactant may thus be formed on exposed surfaces of the liner 110.

The surfactant may include a cationic surfactant, a non-ionic surfactant or combinations thereof. Non-limiting examples of cationic surfactants include quaternary cations, such as lauryl trimethylammonium bromide. Non-limiting examples of nonionic surfactants include polyoxyetheylene glycol alkyl ethers and polyoxypropylene glycol alkyl ethers. In some embodiments, one or more cationic surfactants and one or more nonionic surfactants are added to the precursor recipe.

The liner 110 may optionally comprise a portion including at least one of silicon atoms and nitrogen atoms. The carbon containing precursors may be selected to alter the composition of the alucone containing film to include at least one of silicon atoms and nitrogen atoms. By way of non-limiting example, the alucone material may include nitrogen by using a nitrogen precursor, such as ammonia, in the deposition process. The alucone material may include silicon by using a silicon precursor during the deposition process. Non-limiting examples of silicon precursors include silicon alkoxides such as TEOS, silicon alkaminates such as tris(dimethylamino)silane (3DMAS), silicon alkylates, silane, disilane, trisilane, and trisilylamine (TSA). Precursors including both silicon and nitrogen may also be used including, but not limited to, silazane, disilazane, trisilazane, cyclosilazanes, or combinations thereof. Each of the silicon content and the nitrogen content of the alucone material may each comprise from between about zero atomic percent (0 at %) and about thirty atomic percent (30 at %) of the alucone composition, such as between about zero atomic percent (0 at %) and about ten atomic percent (10 at %), between about ten atomic percent (10 at %) and about twenty atomic percent (20 at %), or between about twenty atomic percent (20 at %) and about thirty atomic percent (30 at %).

In some embodiments, the liner 110 may, optionally, be exposed to an oxygen source to oxidize and densify the alucone. For example, the alucone in the liner 110 may be oxidized to cross-link the organic components or to replace the organic components with oxygen, converting the alucone to an aluminum oxide or a carbon-doped aluminum oxide, which have a higher density than the alucone material. Suitable oxidants may include an oxygen plasma, ozone, water, nitrous oxide ($N_2O$), or combinations thereof. For example, the alucone may be oxidized by direct partial oxidation, ALD type $H_2O$ or $O_2$ exposure, or combinations thereof.

The alucone and the aluminum oxide of the liner 110 may exhibit different etch characteristics due to their different densities. The alucone may be removed with dry plasma etchants, whereas the aluminum oxide exhibits a resistance to dry plasma etching. Suitable dry etchants for removing the alucone of the liner 110 may include a chloride based or a boron trichloride ($BCl_3$) based dry etch chemistry with ion bombardment. The dry etch process may be suitable for removing the alucone in a vertical direction, such as at the bottom of trenches in between adjacent stack structures.

The alucone may also be removed with a semi-aqueous or a solvent wet chemistry including an organic acid or an organic base. The solvent may include dimethyl sulfoxide (DMSO), n-methyl-2-pyrrolidone (NMP), monoethanolamine (MEA), or combinations thereof. The solvent may also include ethylenediaminetetraacetic acid (EDTA), acetic acid, ammonium hydroxide, or combinations thereof.

The aluminum oxide may be removed with an aqueous solution comprising an inorganic acid or inorganic base. The solution may include hydrofluoric acid (HF), hydrochloric acid (HCl), phosphoric acid, sulfuric acid, or combinations thereof. Post etch residues may be removed by cleaning with solutions comprising acetic acid, citric acid, dilute $NH_4OH$, or combinations thereof. After cleaning, a portion of the underlying aluminum oxide may remain.

Thus, the etchability of the liner 110 may be tuned by altering the amount of the alucone material relative to the amount of the aluminum oxide material to provide favorable etch characteristics. In some embodiments, the alucone and aluminum oxide may be removed with a solvent containing both inorganic acids or bases and organic acids or bases.

The liner 110 comprising the alucone may be more easily removed than a liner material comprising only aluminum oxide. For example, the liner 110 including the alucone material may be removed without damaging surrounding materials, such as materials comprising the stack 105 structures. By way of non-limiting example, the alucone containing liner may be etched with a dry plasma etch or with a semi-aqueous based or solvent based chemistry that may not damage the underlying materials. In contrast, the wet etching chemistries such as HF, HCl, phosphoric acid, or sulfuric acid solutions, used to remove aluminum oxide materials may damage underlying materials. Thus, the alucone containing liner may be removed without using the aggressive etch chemistries needed to remove aluminum oxide.

The liner 110 comprising the alucone may be more easily removed (i.e., punched through) during removal acts than a liner comprising a homogeneous aluminum oxide material. For example, the alucone may be more easily etched or punched through with a dry etch chemistry, such as a dry plasma etch, than an aluminum oxide. It is believed that in a dry etch chemistry relying on long-projectile ion bombardment, the less dense alucone is more easily removed than the more dense aluminum oxide. Thus, by replacing at least a portion of the aluminum oxide with alucone, the liner 110 may be more easily removed with dry etchants than an aluminum oxide. As plasma etching may be configured to remove materials in a direction perpendicular to the plasma source, plasma etching may be suitable to remove the liner 110 from horizontal portions of the structure, such as from a bottom surface of trenches in between adjacent stack structures.

The alucone containing liner may also be advantageous over an aluminum oxide liner because the liner 110 comprising alucone may be less prone to resputtering during etching.

The liner materials may be used in various semiconductor devices to protect various materials such as phase change materials, chalcogenides, carbon materials, or other materials during processing. For example, the liner materials may be used in 3D structures such as 3D cross-point memory structures or in 3D-NAND structures. The aluminum-containing material of the liner may be removed before formation of the completed 3D structures or may remain in the 3D structures.

Figure 2A:
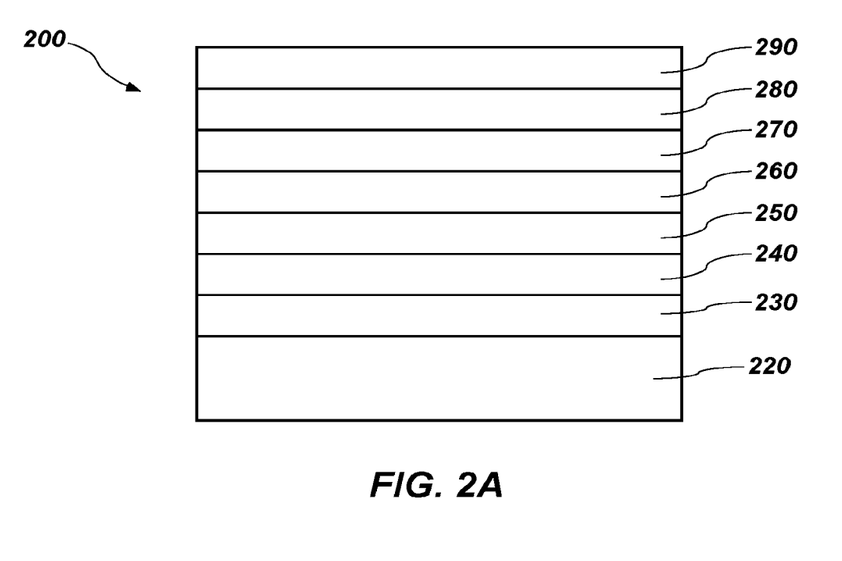
FIG. 2A through FIG. 2F are simplified cross-sectional views of a 3D semiconductor structure according to some embodiments of the present disclosure, the semiconductor structure including a liner at various stages of processing.

Referring to FIG. 2A, a 3D cross-point memory structure 200 is shown at an intermediate processing stage. The structure 200 may include various materials formed over a substrate 220. The substrate 220 may be a base material or construction upon which additional materials are formed. The substrate 220 may be a semiconductor substrate, a base semiconductor layer on a supporting structure, a metal electrode or a semiconductor substrate having one or more layers, structures or regions formed thereon. The substrate 220 may be a conventional silicon substrate or other bulk substrate comprising a layer of semiconductive material. As used herein, the term "bulk substrate" means and includes not only silicon wafers, but also silicon-on-insulator ("SOI") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or undoped.

The structure 200 may include a conductive material 230 formed over the substrate 220. A bottom electrode material 240 may be formed over the conductive material 230. A switching diode material 250 may be formed over the bottom electrode material 240. A middle electrode material 260 may be formed over the switching diode material 250. A phase change material 270 may be formed over the middle electrode material 260. A top electrode material 280 may be formed over the phase change material 270 and a hard mask material 290 may be formed over the top electrode material 280. The hard mask material 290 may comprise a nitride material such as a silicon nitride. The materials of the structure 200 may be formed on the substrate 220 by conventional techniques, which are not described in detail herein.

The conductive material 230 may comprise any conductive material including, but not limited to, tungsten, aluminum, copper, titanium, tantalum, platinum, alloys thereof, heavily doped semiconductor material, a conductive silicide, a conductive nitride, a conductive carbide, or combinations thereof. In some embodiments, the conductive material 230 is tungsten.

The bottom electrode material 240, the middle electrode material 260, and the top electrode material 280 may be formed from the same or different materials. The electrode materials 240, 260, 280 may be formed from a conductive material such as tungsten, platinum, palladium, tantalum, nickel, titanium nitride (TiN), tantalum nitride (TaN), tungsten nitride (WN), polysilicon, a metal silicide, or a carbon material. In some embodiments, the bottom electrode material 240, middle electrode material 260, and the top electrode material 280 are formed from a carbon material and comprise carbon electrodes.

Each of the switching diode material 250 and the phase change material 270 may comprise a chalcogenide material, such as a chalcogenide-metal ion glass, a chalcogenide glass, or other materials. The chalcogenide material may include sulfur, selenium, tellurium, germanium, antimony, or combinations thereof. The chalcogenide material may be doped or undoped or may have metal ions mixed therein. By way of non-limiting example, suitable chalcogenide alloys may include alloys including indium, selenium, tellurium, antimony, arsenic, bismuth, germanium, oxygen, tin, or combinations thereof. The switching diode material 250 and the phase change material 270 may include chalcogenide materials having the same composition or different compositions. In some embodiments, the switching diode material 250 and the phase change material 270 comprise different chalcogenide materials.

Figure 2B:
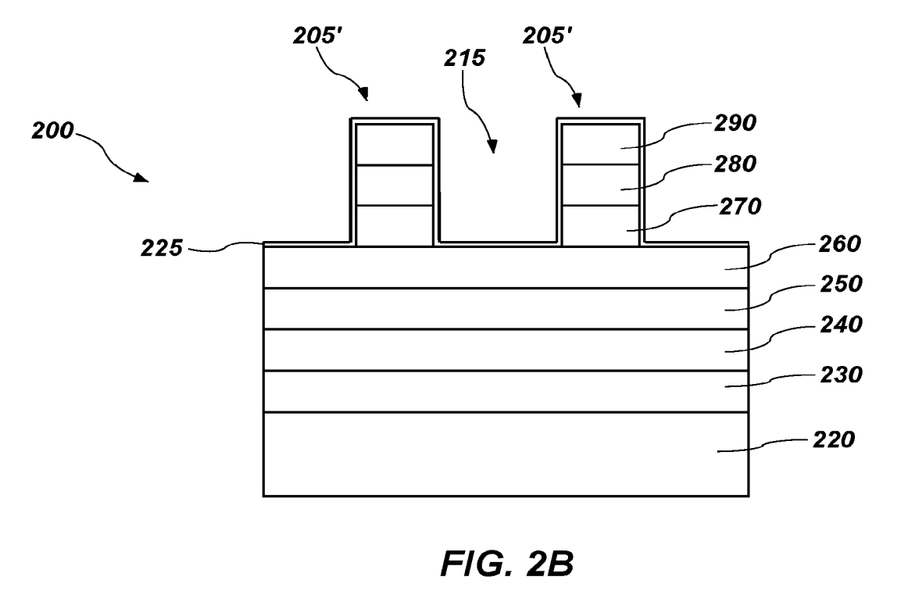

Referring to FIG. 2B, partial stacks 205' may be formed in structure 200. By way of non-limiting example, a portion of hard mask material 290, top electrode material 280, and phase change material 270 may be removed to expose a portion of the middle electrode material 260 and form the partial stacks 205'. The desired portion of the hard mask material 290 may be removed through a mask or reticle (not shown) by conventional techniques, which are not described in detail herein. The patterned hard mask material 290 may be used as a mask to remove the underlying portions of the top electrode material 280 and phase change material 270. The partial stacks 205' may be formed by an isotropic etch process, such as dry plasma etching or reactive ion etching. Adjacent partial stacks 205' may be separated from one another by a distance of between about 20 nm and about 60 nm, such as between about 20 nm and about 40 nm, or between about 40 nm and about 60 nm. In one embodiment, the adjacent partial stacks 205' are separated by about 40 nm. Although a distance between adjacent partial stacks 205' shown in FIG. 2B appears approximately equal to a height of the partial stacks 205', in reality, the height of the partial stacks 205' may be much greater than the distance between the partial stacks 205'.

A partial liner 225 may be substantially conformally formed over the partial stacks 205'. The partial liner 225 may be comprised of alucone and, optionally aluminum oxide, as described above with reference to FIG. 1A through FIG. 1C. By way of example, the partial liner 225 may be formed of alucone, a gradient of alucone and aluminum oxide, or a seed material of aluminum oxide over which the alucone is formed. If the partial liner 225 includes the seed material of aluminum oxide, the aluminum oxide may be in contact with the partial stacks 205'. For example, the aluminum oxide portion may be in contact with the top electrode material 280, the phase change material 270, and other portions of the partial stacks 205', with the alucone portion overlying the aluminum oxide portion. The partial liner 225 may contact sidewalls of the partial stacks 205', such as sidewalls of the hard mask material 290, the top electrode material 280, and the phase change material 270. The aluminum oxide portion of the partial liner 225 may be formed by atomic layer deposition and the alucone portion of the partial liner 225 may be formed by molecular layer deposition as described above. Although the partial liner 225 is shown in FIG. 2B as being formed over the middle electrode material 260 at the bottom of trench 215, the partial liner 225 may be formed on any portion of the partial stacks 205', depending on where the partial etch is terminated.

The partial liner 225 may have a thickness as low as about 5 Å or the partial liner 225 may completely fill the trenches 215. In some embodiments, the partial liner 225 has a thickness ranging from between about 5 Å and about 30 Å. For example, the partial liner 225 may have a thickness of between about 5 Å and about 10 Å, between about 10 Å and about 20 Å, or between about 20 Å and about 30 Å. The partial liner 225 may be formed by conducting one or more ALD cycles, one or more MLD cycles, or combinations thereof. For example, the partial liner 225 may be formed by performing one MLD cycle. In some embodiments, sufficient ALD and MLD cycles may be performed to completely fill the trenches 215 with the partial liner 225.

Figure 2C:
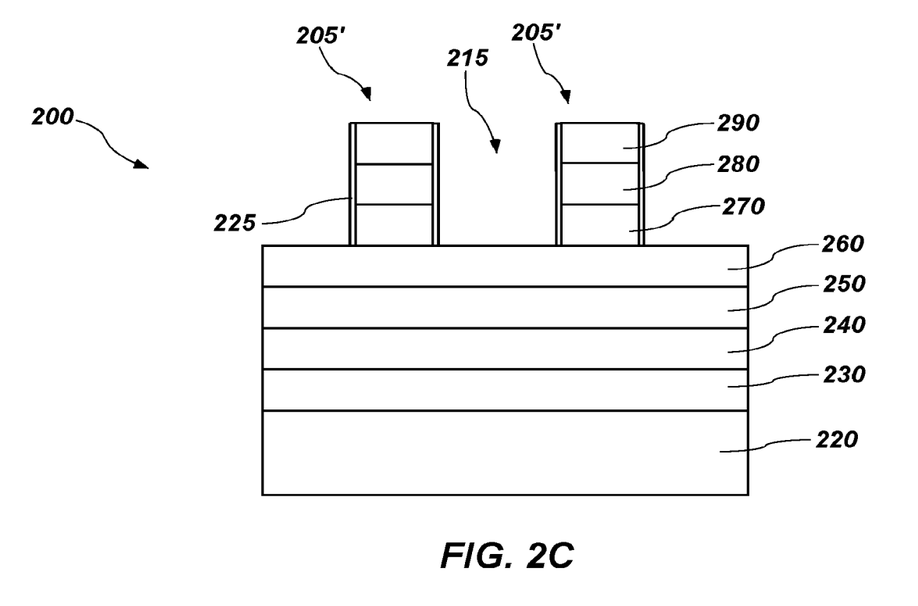

Referring to FIG. 2C, the partial liner 225 may be removed from a top horizontal portion of the partial stacks 205' and from a bottom horizontal portion of the trenches 215. For example, the partial liner 225 may be removed from over the hard mask material 290 and from a surface of the middle electrode material 260. The partial liner 225 may remain on sidewalls of the partial stacks 205' and may protect the top electrode material 280 and phase change material 270. These portions of the partial liner 225 may be removed by a dry plasma etch. Suitable etchants may include a chlorine ($Cl_2$) based dry etch chemistry with ion bombardment, a boron trichloride ($BCl_3$) based dry etch chemistry with ion bombardment, or combinations thereof. Thus, these portions of the partial liner 225 may be removed without using aggressive wet etch chemistries that may damage the partial stacks 205', sidewalls of which are protected by the remaining portions of the partial liner 225. The portions of the partial liner 225 on sidewalls of the partial stacks 205' may remain after the plasma dry etch process and may protect the partial stacks 205' during subsequent processing.

Figure 2D:
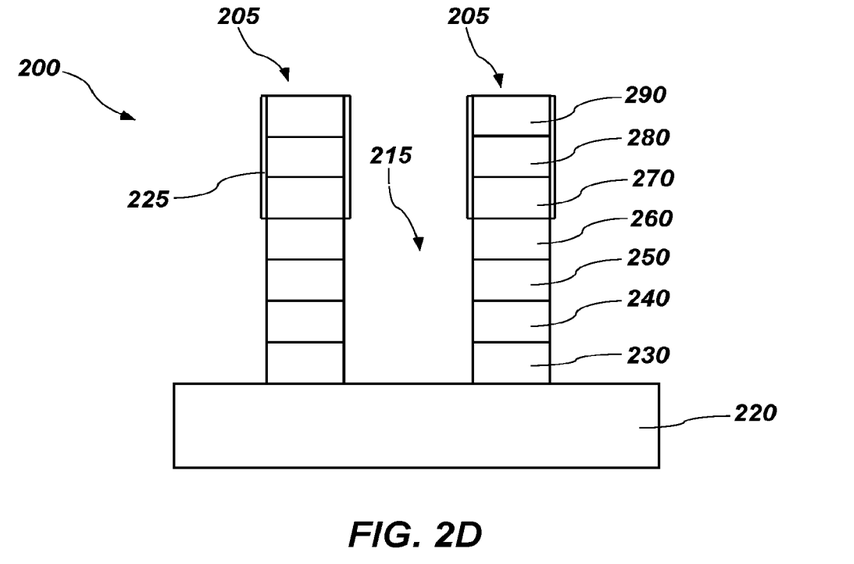

Referring to FIG. 2D, the depth of the trenches 215 may be increased by removing exposed portions of the underlying materials of the partial stacks 205', thereby forming stacks 205. The exposed portions of the middle electrode material 260, the switching diode material 250, the bottom electrode material 240, and the conductive material 230 may be removed while the partial liner 225 remains on the sidewalls of the top electrode material 280 and phase change material 270. By way of non-limiting example, the portions of the middle electrode material 260 and the bottom electrode material 240 may be removed with an oxygen based plasma etch. The switching diode material 250 may be removed with a gas mixture comprising $H_2$, $CH_4$, and $O_2$. The conductive material 230 may be removed with a sulfur hexafluoride ($SF_6$) etch. Since the hard mask material 290 protects a top surface of the stack 205 and the partial liner 225 protects the sidewalls of the stack 205 materials, a critical dimension (CD) of the top portion of the stacks 205 (including hard mask material 290, top electrode material 280, and phase change material 270) may be substantially similar to the CD of the bottom portion of the stacks 205. Thus, the partial liner 225 on the sidewalls of the stack 205 materials prevents the CD of the top portion of the stacks 205 from increasing as the depth of the trenches 215 increases (i.e., as a bottom portion of the stacks 205 is formed). The resulting stacks 205 may have an aspect ratio of between about 10:1 and about 12:1, although the aspect ratio may be higher or lower depending on the desired final structure.

Figure 2E:
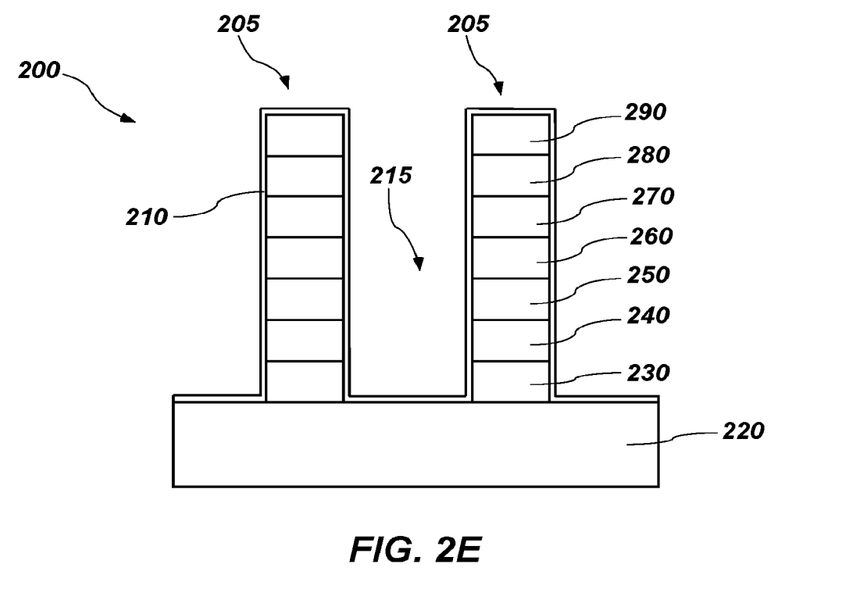

In some embodiments, a full liner 210 may be formed over the stacks 205, as shown in FIG. 2E. Referring back to FIG. 2A, portions of the materials overlying the substrate 220 may be removed to expose a top surface of the substrate 220. Rather than terminating the etch on the middle electrode material 260 or another intermediate material, portions of all the materials overlying the substrate 220 are removed until the top surface of the substrate 220 is exposed. The full liner 210 may be conformally formed over sidewalls and a top horizontal portion of the stacks 205 as well as the top surface of the substrate 220 in the trenches 215. The material of the full liner 210 may be substantially the same as the material of the partial liner 225. For example, the full liner 210 may include alucone, alucone and aluminum oxide, a gradient of alucone, or combinations thereof. In some embodiments, the full liner 210 may optionally include silicon atoms and/or nitride atoms as described above with reference to FIG. 1A through FIG. 1C.

The full liner 210 may have a thickness as low as about 5 Å or the full liner 210 may completely fill the trenches 215. In some embodiments, the full liner 210 has a thickness ranging from between about 5 Å and about 30 Å. For example, the full liner 210 may have a thickness of between about 5 Å and about 10 Å, between about 10 Å and about 20 Å, or between about 20 Å and about 30 Å. The full liner 210 may be formed by conducting one or more ALD cycles, one or more MLD cycles, or combinations thereof. For example, the full liner 210 may be formed by performing one MLD cycle. In other embodiments, sufficient ALD and MLD cycles may be performed to completely fill the trenches 215 with the full liner 210.

In some embodiments, the full liner 210 may be further processed to alter the chemistry of the full liner 210 after it has been deposited. For example, the full liner 210 may be oxidized as previously described, to convert the alucone to aluminum oxide.

Figure 2F:
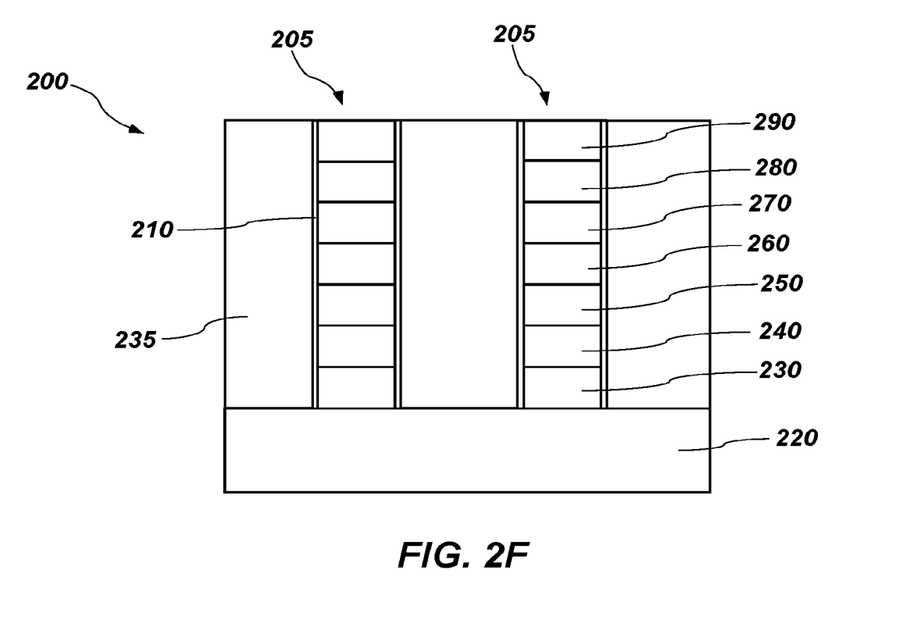

Referring to FIG. 2F, the horizontal portions of the full liner 210 may be removed from a top horizontal portion of the stacks 205 and from a bottom horizontal portion of the trenches 215 so that sidewalls of the stacks 205 remain protected by the full liner 210 and a top surface of the stack 205 remains protected by the hard mask material 290. By way of example only, a dry plasma etch as described above with respect to FIG. 2C may remove the full liner 210 from the tops of the stacks 205 and from bottom portions of the trenches 215. The trenches 215 between adjacent stacks 205 may be filled with a dielectric material 235 such as a silicon dioxide material. Additional process acts may then be conducted to form a complete 3D cross-point memory structure 200 from the structure in FIG. 2F. The additional process acts may be formed by conventional techniques, which are not described in detail herein.

Accordingly, a semiconductor device is disclosed. The semiconductor device comprises stack structures comprising at least two chalcogenide materials overlying a substrate. A liner comprising alucone is on sidewalls of at least a portion of the stack structures.

A method of forming a semiconductor device is also disclosed. The method comprises forming stack structures over a substrate and forming a liner comprising alucone over the stack structures. The liner is removed from a bottom portion of trenches between the stack structures while leaving the liner on sidewalls of the stack structures.

Figure 3A:
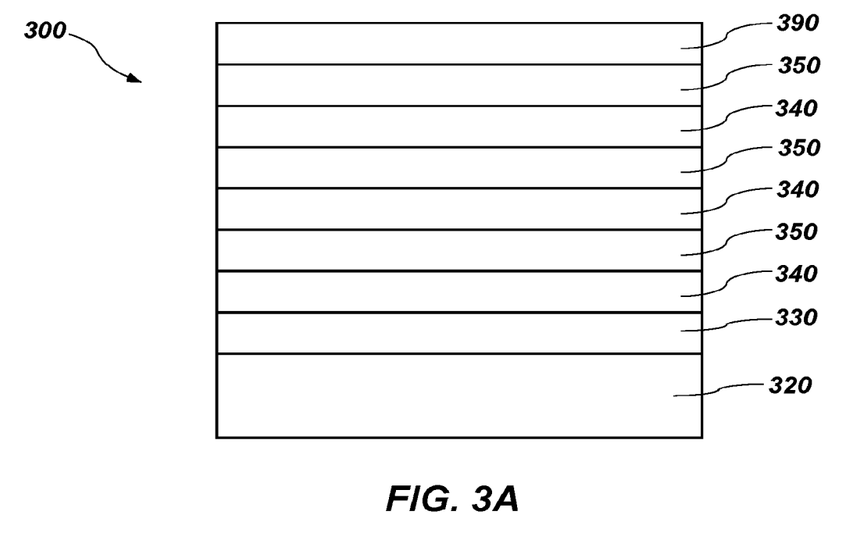
FIG. 3A through FIG. 3G are simplified cross-sectional views of another 3D semiconductor structure according to some embodiments of the present disclosure, the semiconductor structure including a liner at various stages of processing.

In other embodiments, the alucone containing liner may be used in a 3D-NAND memory structure. Referring to FIG. 3A, a semiconductor structure 300 is shown that may be further processed to form a 3D-NAND flash memory device. The semiconductor structure 300 includes alternating conductive materials 350 and dielectric materials 340 formed over a substrate 320. The alternating conductive materials 350 and dielectric materials 340 may be formed by conventional techniques. The substrate 320 may include a material similar to substrate 220 described with reference to FIG. 2A. The substrate 320 may include doped regions that form source and drain regions. In some embodiments, a conductive material such as a source or drain may be formed on the substrate 320 or within the substrate 320. In some embodiments, a data/sense line (e.g., bit line, digit line, word line, etc.) (not shown), rather than a source or drain may be formed over the substrate 320. The data/sense line may be formed from doped polysilicon, tungsten silicide, tungsten, or other conventional materials. A control gate material 330 may be formed over the substrate 320. An etch stop material (not shown) may be formed over the control gate material 330. The etch stop material may comprise an aluminum oxide material, a silicon nitride material, or other conventional material selected so that the materials of the stacks 305 may be selectively removed without removing the other materials of the semiconductor structure 300.

The control gate material 330 may comprise a control gate such as a select source gate (SSG) or a select gate drain (SGD) and may be electrically coupled to a source or drain region or a data/sense line on the substrate 320. The control gate material 330 may comprise the same or different materials than the conductive material 350.

The dielectric material 340 may comprise an insulative material such as a silicon oxide. In some embodiments, the alternating dielectric materials 340 comprise silicon dioxide. The conductive material 350 may comprise any known conductive material. By way of non-limiting example, the alternating conductive materials 350 may comprise n-doped polysilicon, p-doped polysilicon, undoped polysilicon, tungsten, aluminum, copper, titanium, tantalum, platinum, alloys thereof, conductive silicides, conductive nitrides, conductive carbides, or combinations thereof. The formation of the dielectric materials 340 and the conductive materials 350 may be repeated to form the alternating materials over the substrate 320.

Figure 3B:
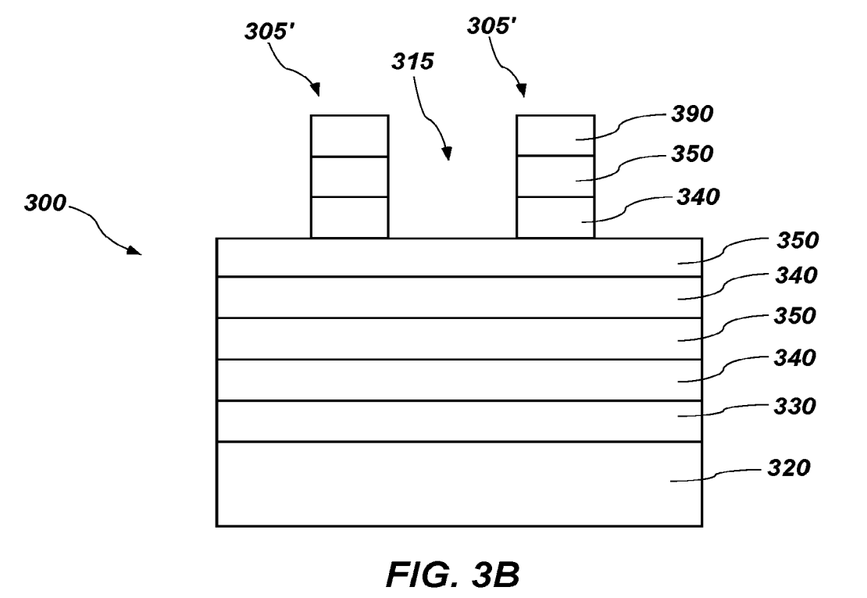

A hard mask 390 may be formed over the 3D-NAND structure 300. The hard mask 390 may be a nitride material such as a silicon nitride. Referring to FIG. 3B, a partial etch may form partial stacks 305' by removing alternating portions of the conductive material 350 and the dielectric material 340. The portions of the conductive material 350 and the dielectric material 340 may be removed with a single etch act, such as by reactive ion etching, dry plasma etching, an anisotropic dry etch process, or other suitable etching method. The partial etch may terminate on one of the dielectric materials 340 or on one of the conductive materials 350.

Figure 3C:
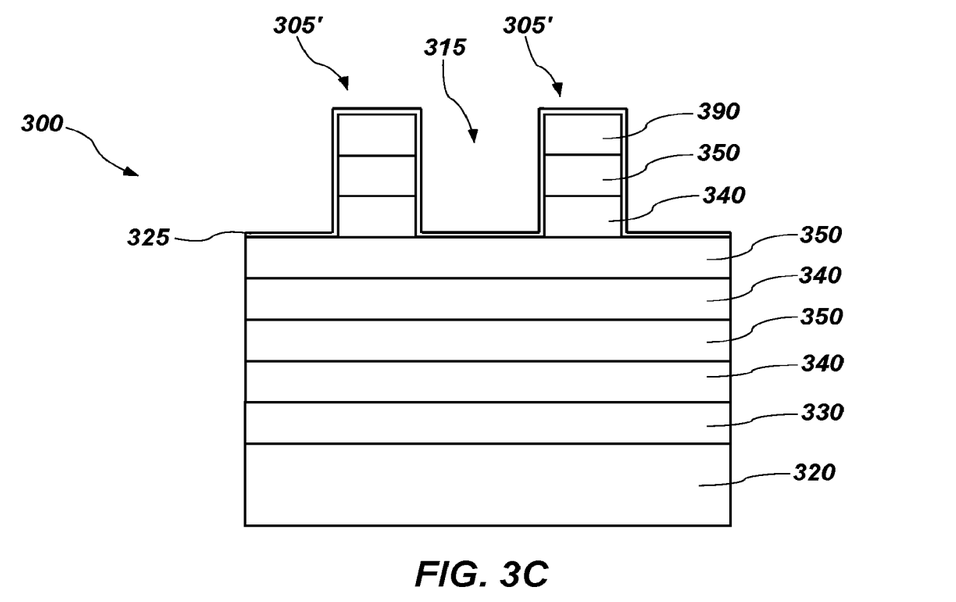

Referring to FIG. 3C, a partial liner 325 may be formed over the partial stacks 305'. The partial liner 325 may be conformally formed over the partial stacks 305'. The partial liner 325 may comprise materials as described above with reference to FIG. 1A through FIG. 1C, and may include alucone, alucone and aluminum oxide, a gradient of alucone, or combinations thereof. In some embodiments, the partial liner 325 may optionally include silicon atoms and/or nitride atoms as described above with reference to FIG. 1A through FIG. 1C. By way of non-limiting example, an aluminum oxide portion of the partial liner 325, if present, may be in contact with the partial stacks 305'.

Figure 3D:
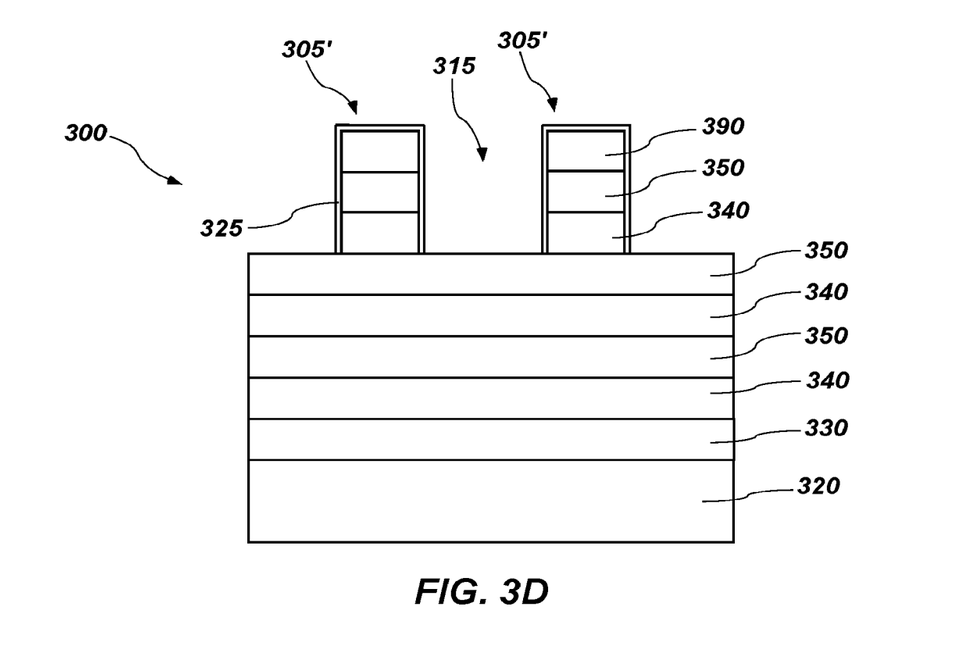

Referring to FIG. 3D, the partial liner 325 may be removed from bottom portions of the trenches 315. Although not shown, the partial liner 325 may be removed from a top horizontal surface of the partial stacks 305'. The partial liner 325 may be removed by a dry plasma etch. The plasma etch may be as described above with reference to FIG. 2C. For example, a dry plasma etch may remove the partial liner 325 from the top horizontal surfaces of the partial stacks 305' and the bottom portion of the trenches 315 without removing the partial liner 325 from sidewalls of the trenches 315. Thus, these portions of the partial liner 325 may be removed without an aggressive wet etch chemistry that may damage the underlying partial stacks 305'. In some embodiments, the partial liner 325 may be oxidized as previously described.

Figure 3E:
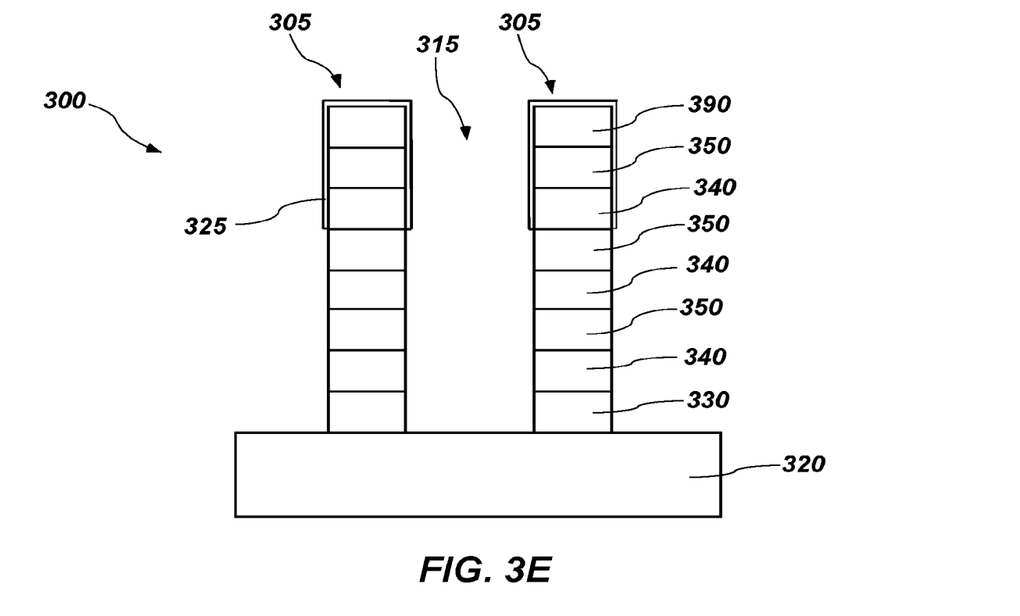

Referring to FIG. 3E, the height of the partial stacks 305' may be increased by continuing to remove exposed portions of the alternating dielectric materials 340 and conductive materials 350, thereby forming stacks 305. By removing exposed portions of the alternating dielectric materials 340 and conductive materials 350, the depth of trenches 315 is increased. The alternating portions of the dielectric material 340 and the conductive material 350 may be removed as described above. The partial liner 325 may protect the alternating dielectric materials 340 and conductive materials 350 at upper portions of the stacks 305 from being damaged and the distance between adjacent stacks may not be increased during the etch. The etch may terminate at the etch stop material (not shown) over the control gate material 330. In other embodiments, the etch may remove at least a portion of the control gate material 330 or at least a portion of the substrate 320 and may terminate on the control gate material 330 or on the substrate 320.

Figure 3F:
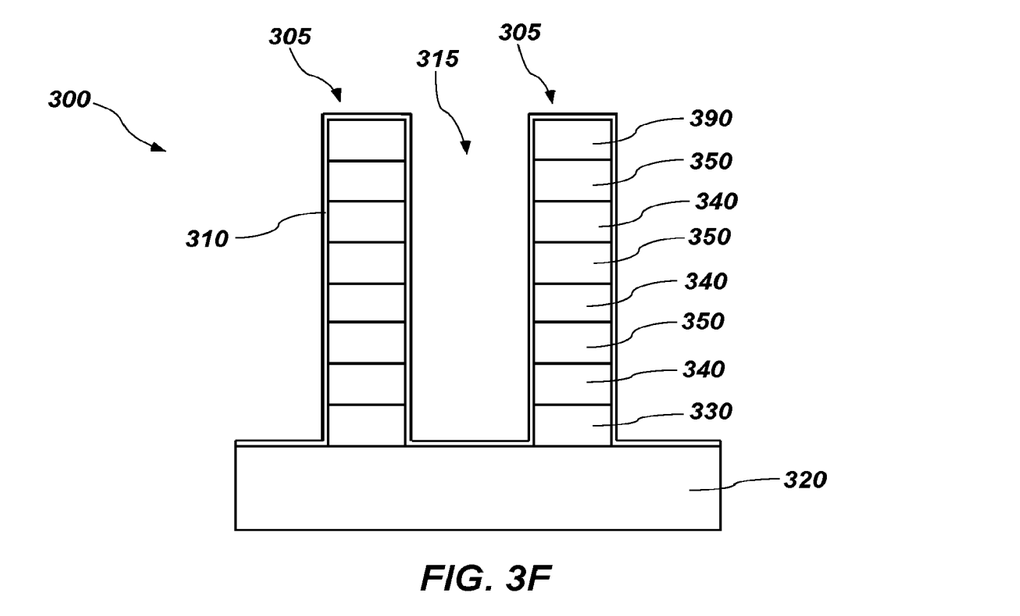

In some embodiments, a full liner 310 may be formed over the stacks 305, as shown in FIG. 3F. Referring back to FIG. 3A, portions of the materials overlying the substrate 320 may be removed to expose a top surface of the substrate 320. Rather than terminating the etch on an intermediate dielectric material 340 or another intermediate material as in FIG. 3B, portions of all the alternating dielectric materials 340 and conductive materials 350 overlying the substrate 320 are removed until the top surface of the substrate 320 is exposed, forming stacks 305. The full liner 310 may be conformally formed over the stacks 305. The full liner 310 may contact alternating portions of the dielectric material 340 and the conductive material 350, the control gate material 330, and a portion of the substrate 320. The full liner 310 may be formed as described above with reference to FIG. 1A through FIG. 1C and may include alucone, alucone and aluminum oxide, a gradient of alucone, or combinations thereof. In some embodiments, the full liner 210 may optionally include silicon atoms and/or nitride atoms as described above with reference to FIG. 1A through FIG. 1C. In some embodiments, the full liner 310 is oxidized as previously described.

Figure 3G:
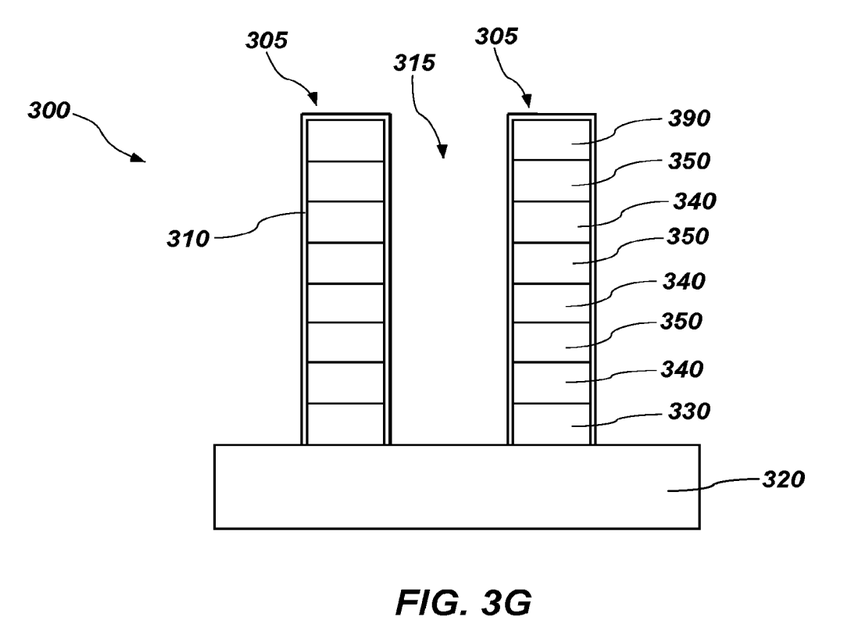

In some embodiments, the full liner 310 or partial liner 325 is removed after the stacks 305 are formed. In other embodiments, the full liner 310 or partial liner 325 remains in the final structure. Referring to FIG. 3G, the full liner 310 may be removed from bottom portions of the trenches 315. Although not shown, the full liner 310 may also be removed from a top horizontal surface of the stacks 305.

Additional processing acts may be performed to complete the 3D-NAND structure. By way of non-limiting example, a charge trap comprising a tunnel dielectric, a charge trapping material, and a charge blocking material may be formed over the full liner 310 or partial liner 325. The tunnel dielectric may comprise a silicon oxide such as silicon dioxide. A charge trapping material such as a silicon nitride may be formed over the tunnel dielectric. A charge blocking material such as a silicon oxide may be formed over the charge trapping material. Thus, an oxide-nitride-oxide (ONO) material may be formed over the material of the full liner 310. In other embodiments, the charge trap may comprise high-k dielectrics such as hafnium oxide, zirconium oxide, aluminum oxide, and low-k dielectrics, or combinations thereof may be formed over the material of the full liner 310 or partial liner 325.

Accordingly, a semiconductor device is disclosed. The semiconductor device comprises stack structures comprising alternating dielectric materials and conductive materials overlying a substrate. A liner comprising alucone is on sidewalls of the stack structures.

While certain illustrative embodiments have been described in connection with the figures, those of ordinary skill in the art will recognize and appreciate that embodiments encompassed by the disclosure are not limited to those embodiments explicitly shown and described herein. Rather, many additions, deletions, and modifications to the embodiments described herein may be made without departing from the scope of embodiments encompassed by the disclosure, such as those hereinafter claimed, including legal equivalents. In addition, features from one disclosed embodiment may be combined with features of another disclosed embodiment while still being encompassed within the scope of the disclosure as contemplated by the inventors.

What is claimed is:

1. A semiconductor device, comprising:
   stack structures overlying a material; and
   a liner on sidewalls of the stack structures, the liner comprising:
      a first portion comprising aluminum oxide in contact with the sidewalls of the stack structures; and
      a second portion comprising alucone contacting the first portion, the second portion further comprising at least one of silicon atoms or nitrogen atoms.

2. The semiconductor device of claim 1, wherein the liner comprises a gradient of alucone and aluminum oxide.

3. The semiconductor device of claim 1, wherein the second portion comprises from about 10 atomic percent to about 20 atomic percent silicon.

4. The semiconductor device of claim 1, wherein the liner comprises a ratio of aluminum oxide to alucone of from about 1:1 to about 1:10.

5. The semiconductor device of claim 1, wherein the stack structures comprise an electrode and a switching material adjacent the electrode.

6. The semiconductor device of claim 1, wherein the liner further comprises a third portion between the first portion and the second portion, the third portion comprising a greater amount of alucone than the first portion.

7. The semiconductor device of claim 1, wherein the stack structures comprise an electrode between a switching material and a phase change material.

8. The semiconductor device of claim 1, wherein the liner has a thickness ranging from about 5 Å to about 30 Å.

9. The semiconductor device of claim 1, wherein the stack structures comprise alternating conductive materials and dielectric materials.

10. A semiconductor device, comprising:
a base material;
3D-NAND memory structures comprising stack structures vertically overlying the base material, each stack structure comprising alternating dielectric materials and conductive materials, the alternating dielectric materials vertically spaced from each other by the conductive materials; and
a liner comprising alucone on sidewalls of the stack structures, the liner comprising a gradient of aluminum oxide and alucone, a concentration of alucone increasing from about zero percent at the sidewalls of each stack structure to about one-hundred percent at an outer surface of the liner distal from the sidewalls of the respective stack structure.

11. The semiconductor device of claim 10, wherein the stack structures comprises a control gate material.

12. The semiconductor device of claim 10, wherein the liner has a thickness between about 5 Å and about 30 Å.

13. The semiconductor device of claim 10, wherein the alternating dielectric materials comprise silicon dioxide.

14. The semiconductor device of claim 10, wherein the alternating conductive materials comprise tungsten.

15. The semiconductor device of claim 10, wherein the liner further comprises from about 10 atomic percent to about 20 atomic percent of at least one of silicon and nitrogen.

16. A method of forming a semiconductor device, the method comprising:
forming stack structures overlying a base material; and
forming a liner on sidewalls of the stack structures, forming the liner comprising:
forming a first portion comprising aluminum oxide in contact with the sidewalls of the stack structures; and
forming a second portion comprising alucone contacting the first portion, the second portion further comprising at least one of silicon atoms and nitrogen atoms.

17. The method of claim 16, wherein forming a second portion comprising alucone contacting the first portion comprises forming the second portion to exhibit a gradient of alucone and aluminum oxide.

18. The method of claim 16, wherein forming stack structures overlying a base material comprises forming stack structures comprising alternating dielectric materials and conductive materials overlying the base material.

* * * * *

UNITED STATES PATENT AND TRADEMARK OFFICE
CERTIFICATE OF CORRECTION

PATENT NO. : 11,223,014 B2  
APPLICATION NO. : 16/446746  
DATED : January 11, 2022  
INVENTOR(S) : Zhe Song et al.

Page 1 of 1

It is certified that error appears in the above-identified patent and that said Letters Patent is hereby corrected as shown below:

In the Specification  
Column 5, Line 10, change "AlP" to --AIP--

Signed and Sealed this  
First Day of March, 2022

Drew Hirshfeld  
*Performing the Functions and Duties of the*  
*Under Secretary of Commerce for Intellectual Property and*  
*Director of the United States Patent and Trademark Office*